US012689137B2

(12) United States Patent
Genau et al.

(10) Patent No.: US 12,689,137 B2
(45) Date of Patent: Jul. 21, 2026

(54) CABLE CONNECTION UNIT FOR A CONNECTION BOX

(71) Applicant: HARTING ELECTRONICS GMBH, Espelkamp (DE)

(72) Inventors: Marc Genau, Lübbecke (DE); Rainer Bussmann, Bad Essen (DE)

(73) Assignee: HARTING ELECTRONICS GMBH, Espelkamp (DE)

( * ) Notice: Subject to any disclaimer, the term of this patent is extended or adjusted under 35 U.S.C. 154(b) by 287 days.

(21) Appl. No.: 18/555,474

(22) PCT Filed: Mar. 28, 2022

(86) PCT No.: PCT/DE2022/100232
§ 371 (c)(1),
(2) Date: Oct. 13, 2023

(87) PCT Pub. No.: WO2022/218465
PCT Pub. Date: Oct. 20, 2022

(65) Prior Publication Data
US 2024/0195087 A1     Jun. 13, 2024

(30) Foreign Application Priority Data

Apr. 14, 2021     (DE) ..................... 10 2021 109 298.1

(51) Int. Cl.
*H01R 4/2429*          (2018.01)
*G01R 31/68*          (2020.01)
(Continued)

(52) U.S. Cl.
CPC ........... *H01R 4/2429* (2013.01); *G01R 31/68* (2020.01); *H01R 4/70* (2013.01); *H01R 12/53* (2013.01); *H01R 43/01* (2013.01)

(58) Field of Classification Search
CPC ........ H01R 4/2429; H01R 4/70; H01R 12/53; H01R 43/01; H01R 2201/20;
(Continued)

(56) References Cited

U.S. PATENT DOCUMENTS 6,099,343 A *   8/2000   Bonvallat ............ H01R 9/2441
379/412
6,196,863 B1 *   3/2001   Schwant ................ H01R 12/67
439/417

(Continued)

FOREIGN PATENT DOCUMENTS

CN          101436741 A     5/2009
CN          202363675 U     8/2012
(Continued)

OTHER PUBLICATIONS

European Patent Office, International Search Report and Written Opinion for international application No. PCT/DE2022/100232, mailed Aug. 19, 2022, 15 pages (with English translation of International Search Report).

(Continued)

*Primary Examiner* — Charles Reid, Jr.
(74) *Attorney, Agent, or Firm* — Seed Intellectual Property Law Group LLP

(57)          ABSTRACT

A cable connection unit for a connection box is provided including a cable, which has at least two electrical conductors surrounded by a cable sheath; a cable seal, which radially surrounds the cable sheath; and a cable organizer, in which the at least two electrical conductors are held in a fanned-out arrangement. A matching connection box has at least one receiving region for the cable connection unit, in which the cable seal and the cable organizer can each be placed. A cover of the connection box may then be folded down, whereby the electrical conductors of the cable are (Continued)

pressed into respective insulation displacement contacts of the connection region and thereby electrically contacted.

18 Claims, 6 Drawing Sheets

(51) Int. Cl.

| | | |
|---|---|---|
| *H01R 4/70* | (2006.01) | |
| *H01R 12/53* | (2011.01) | |
| *H01R 43/01* | (2006.01) | |

(58) Field of Classification Search

CPC .... H01R 12/515; H01R 9/2475; H01R 9/031; H01R 9/2416; H01R 13/405; H01R 4/2433; G01R 31/68

USPC ......................................................... 439/395

See application file for complete search history.

(56) References Cited

U.S. PATENT DOCUMENTS

| | | | | | |
|---|---|---|---|---|---|
| 2002/0094715 | A1 * | 7/2002 | Pepe | .................... | H01R 4/2433 |
| | | | | | 439/417 |
| 2006/0148299 | A1 * | 7/2006 | Peng | .................... | H01R 4/2433 |
| | | | | | 439/342 |
| 2009/0124109 | A1 | 5/2009 | Jaouen et al. | | |
| 2013/0065424 | A1 | 3/2013 | Parrish | | |

FOREIGN PATENT DOCUMENTS

| | | | | | |
|---|---|---|---|---|---|
| CN | 102801031 | A | 11/2012 | | |
| CN | 203774468 | U | 8/2014 | | |
| DE | 19816216 | A1 | 10/1999 | | |
| DE | 102004007525 | A1 | 9/2005 | | |
| DE | 202005019522 | U1 | 4/2007 | | |
| DE | 102008021868 | A1 | 1/2009 | | |
| DE | 102012014519 | B3 | 12/2013 | | |
| DE | 112012003826 | T5 | 8/2014 | | |
| DE | 102020114330 | A1 | 3/2021 | | |
| EP | 0734095 | A1 | 9/1996 | | |
| EP | 2061118 | A1 * | 5/2009 | ........... | H01R 4/2433 |
| EP | 2230728 | A1 * | 9/2010 | ............ | H01R 4/242 |
| WO | 2021044156 | A1 | 3/2021 | | |

OTHER PUBLICATIONS

German Patent Office, Office Action for German application No. 10 2021 109 298.1 dated Dec. 14, 2021, 5 pages.

* cited by examiner

CABLE CONNECTION UNIT FOR A CONNECTION BOX

BACKGROUND

Technical Field

The present disclosure relates to a cable connection unit, a system comprising of a connection box and such a cable connection unit, and to a method for connecting a cable connection unit to a connection box.

Such cable connection units are employed for electrically contacting connection boxes. Such connection boxes are used in particular for installation in buildings and can be equipped with an electronic control system, in particular for servomotors of ventilation systems.

Description of the Related Art

The document DE 10 2020 114 330 A1 discloses a connection box to which electrical conductors of a cable can be connected, without using tools, with the aid of a so-called connection terminal.

However, in this solution the individual conductor connections are not sealed. Moisture can penetrate in this case and possibly damage electronics implemented in the connection box.

Connection boxes are therefore often equipped with plug connector sockets, as disclosed in the document DE 10 2012 014 519 B3. Such a construction is costly, however. Moreover, cables with plug connectors have to be prefabricated, which is time-consuming.

A search made by the German Patent and Trademark Office in the priority application has found the following prior art: DE 10 2012 014 519 B3, DE 10 2004 007 525 A1, DE 10 2020 114 330 A1, DE 20 2005 019 522 U1, and DE 11 2012 003 826 T5.

BRIEF SUMMARY

Embodiments of the present disclosure provide a simple and cost-effective cable connection unit for a connection box. The installation of the connection box is here intended to be effected without the use of tools and in a time-saving fashion.

The cable connection unit described herein is provided for connection to and electrical contacting of a connection box. The connection box generally comprises electronics, in particular control electronics, for servomotors of ventilation systems. In addition, the connection box has a printed circuit board which is protected by the housing of the connection box and is contacted electrically via the cable connection unit.

The cable connection unit comprises a cable which has at least two but preferably at least four electrical conductors which are surrounded by a cable sheath. The individual conductors are also each enclosed by an insulating conductor sheath. In this case, the term a multi-core cable can also be used. The conductors may be so-called solid conductors and not stranded conductors. Electrical conductors with more than four conductors may, however, also be used.

The cable connection unit has a cable seal which radially encloses the cable sheath. The cable seal is designed as essentially cylindrical and so that it encloses the cable sheath. The cable seal has a toroidal basic shape. The cable seal is advantageously a one-piece injection-molded part which is fastened to the cable sheath by an injection-molding process. The cable seal has a sealing function but at the same time represents a strain relief for the connected cable.

The cable connection unit has a cable manager which is provided for holding and fixing the four electrical conductors of the cable. The four electrical conductors lie next to one another in a plane in the cable manager. They are spaced apart from one another to such an extent that they can be contacted by suitable insulation displacement terminals of insulation displacement contacts. At one end, insulation displacement contacts have an insulation displacement terminal which is provided for electrically contacting the electrical conductors to be connected. At the other end, the insulation displacement contacts consist, for example, of a contact pin which is electrically contacted with a trace of a printed circuit board.

In the case of insulation displacement contacting, the electrical conductors are pushed between two metal blades, as a result of which the insulation of the conductors is penetrated and an electrical contact between the conductor and the insulation displacement terminal is produced. Insulation displacement terminals are known, for example, from the document DE 11 2012 003 826 T5 and are therefore not described further below.

The electrical cables are held spaced apart from one another and fanned out such that they can be pushed at the same time into an insulation displacement terminal array. This procedure will be described more precisely below. The term an insulation displacement terminal array is used when two or more insulation displacement contacts are arranged as a group in a connection region.

The cable manager may be a one-piece injection-molded part which is fastened to the electrical conductors or molded thereto by an injection-molding process. By virtue of such prefabrication of the cable manager, the electrical conductors are reliably ordered in sequence, which reduces the likelihood of errors during installation.

Alternatively, the cable manager may have a two-part design, wherein the two parts can be interlocked with each other via latching means or devices. The conductors are thus first inserted by hand into receptacles of the first part. The inserted conductors are finally fixed by the cable manager by virtue of the interlocking with the second part. The individual receptacles can be color-coded and correlate with the colors of the conductor insulations. The fabrication of the cable manager is simplified as a result.

The cable manager may have two contact openings which each have an essentially rectangular design. The contact openings are provided for the subsequent insulation displacement contacting.

The contact openings are advantageously arranged, viewed in the plugging direction, one behind the other and offset relative to one another. A so-called polarization can consequently be generated which prevents faulty plugging or faulty contacting of the cable manager.

In an embodiment of the disclosure, the cable has in each case one cable manager and one cable seal on both ends of the cable. The cable connection unit is thus suitable for electrically connecting two connection boxes without the use of tools.

The cable preferably has a length of no more than three meters. This length has proved to be adequate in the field of installation in buildings. The cables do not have to be shortened by hand, which reduces the overall installation time.

The system described herein consists of a connection box and an above described cable connection unit. The connection box preferably has control electronics for a servomotor which is provided in particular for regulating the ventilation of the building.

The connection box has at least one socket region for the cable connection unit in which the cable seal and the cable manager can each be inserted. The corresponding components may be easily pre-interlocked in order to simplify the installation procedure.

The socket region of the connection box preferably has insulation displacement contacts. In each case two insulation displacement terminals are here associated with a contact opening of the cable connection unit.

The connection box advantageously has a hinged cover. The cover has a dual function in this case. On the one hand, it protects the connection box from the ingress of media such as dust and water. On the other hand, the individual conductors can be pushed into the insulation displacement terminals of the insulation displacement contacts via the cover for the purpose of electrical contacting. For this purpose, a sufficient lever force is made available via the cover such that installation of the connection box is possible with a low amount of force in addition to without the use of tools.

In some embodiments, the cable manager has testing openings. Each testing opening is here associated with one electrical conductor. The individual conductors can be accessed via the testing openings even when they are already electrically connected to the connection box.

The system described herein may have a test device by which the correct electrical contacting between the respective insulation displacement terminal and the associated electrical conductor can be checked. For this, the test device has contact pins which can each be plugged into a testing opening of the cable manager.

The contact pins pierce the conductor and thus establish electrical contact with the electrical conductor. Correct electrical contacting of the individual conductors and hence the whole connection box can be checked via implemented testing electronics. The contact pins of the test device can then be pulled out simply with virtually no residue. The small hole in the sheath of the electrical conductor closes automatically by virtue of the tension of the material and is not relevant for the further functioning of the system.

After the connection box has been fastened to the provided place, for example a housing wall, the electrical installation method proceeds as follows below.

First, the cable seal and the cable manager are inserted into a connection region of the connection box. Then, the cover of the connection box is folded down, as a result of which the electrical conductors of the cable are each pushed into an insulation displacement terminal of the connection region and consequently electrically contacted.

Correct electrical installation can then be checked with the above described test device.

Alternatively, the cable manager may also be pushed down with the test device by the cover contacting process.

A first cable end may be, as described above, connected to a first connection box and a second end of the cable may be similarly connected to a second connection box. Installation in buildings can take place quickly and effectively with a connection box and a cable connection unit described herein.

The connection unit can feature cable managers on both ends such that two adjacent connection boxes can be electrically contacted with each other via a connection unit. The connection boxes can each have contacting sockets, for example two contacting sockets, for connection units.

BRIEF DESCRIPTION OF THE SEVERAL VIEWS OF THE DRAWINGS

Embodiments of the present disclosure are illustrated in the drawings and explained in detail below.

DETAILED DESCRIPTION

The figures may contain partially simplified schematic illustrations. Identical reference signs are in part used for the same but possibly non-identical elements. Different views of the same elements could be at a different scale. Specifications such as left and right are made with reference to the perspective of the respective figure.

Figure 1:
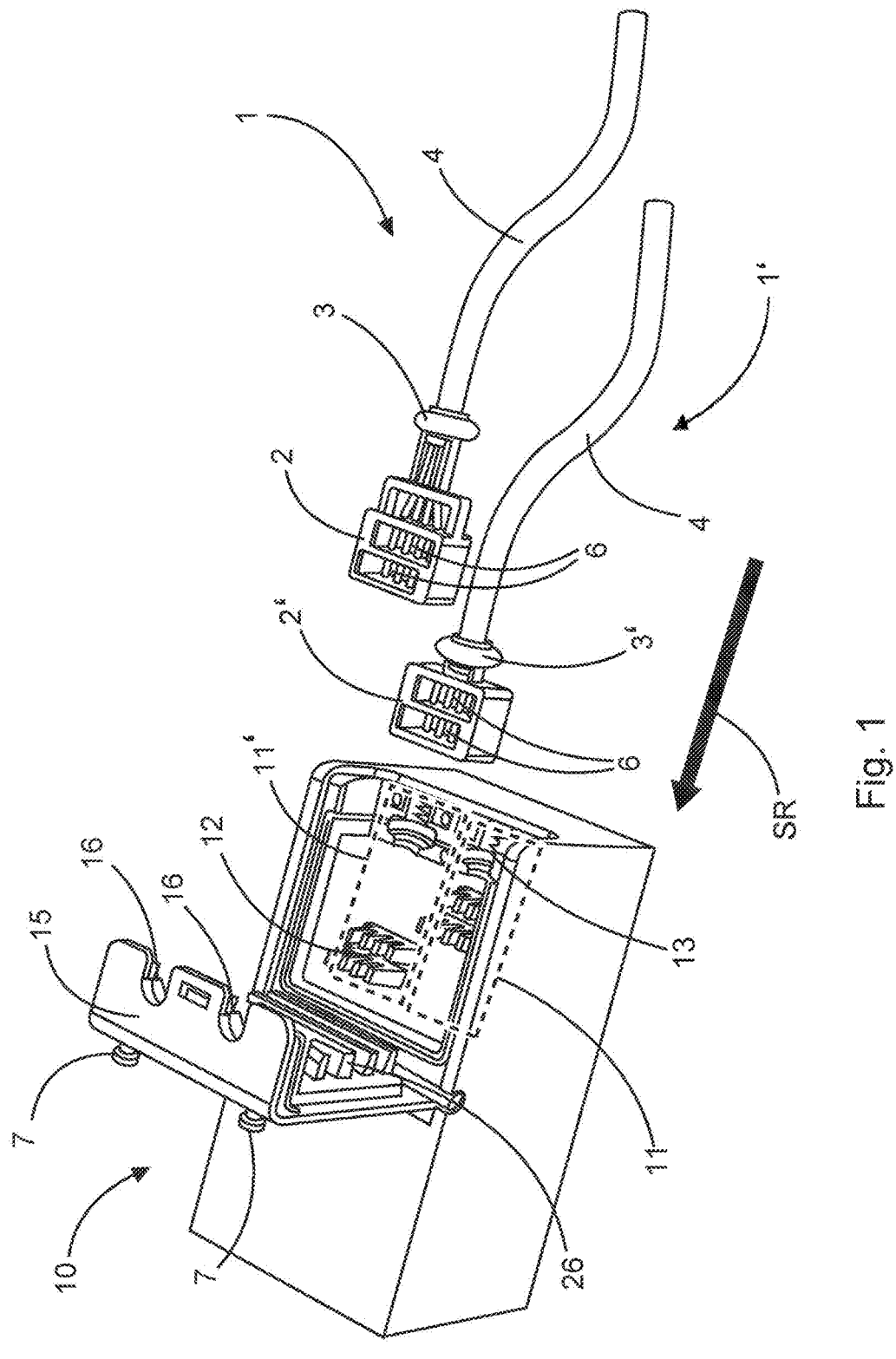
FIG. 1 shows a perspective illustration of two cable connection units and an associated connection box.
Figure 8:
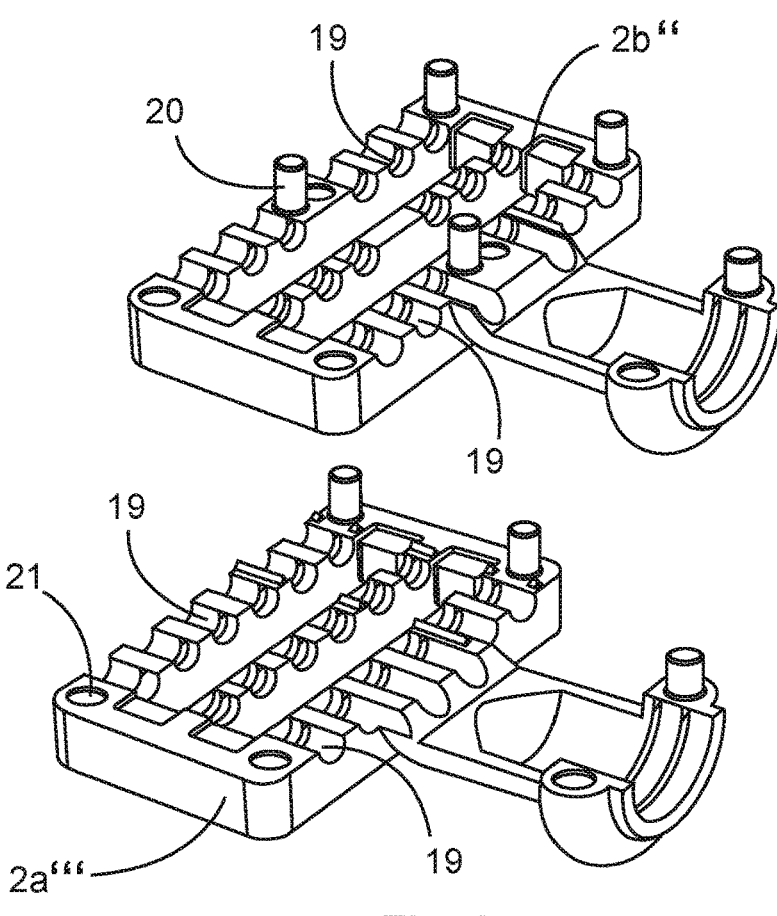
FIG. 8 shows a perspective illustration of a further embodiment of a two-part cable manager with an integrally formed cable seal in an uninterlocked state.

Two variants of cable connection units 1, 1' are shown in FIG. 1. The cable connection unit 1, 1' consists of a cable 4 at one cable end of which the electrical conductors 5 have had the cable sheath removed. In some embodiments, an at least four-core cable is used. However, more than four conductors, for example six conductors 5 as shown in FIG. 8, can also be present.

An injection-molded cable seal 3, 3' is provided in front of the conductors 5 with the cable sheath removed. The individual conductors 5 are fixed in a cable manager 2 in a fanned-out fashion. The cable manager 2 has two contact openings 6 which are arranged, viewed in the plugging direction, one behind the other but offset relative to one another parallel to the plugging direction SR.

The connection box 10 is illustrated in its open state in FIG. 1. The connection box 10 has a connection region 11, 11' which is identified or highlighted in FIG. 1 by a dashed rectangle. A printed circuit board plug connector 12 is arranged in the connection region 11, 11'. The printed circuit board plug connector 12 has insulation displacement contacts with contact pins 9 for the printed circuit board 17 and insulation displacement terminals 14 for the electrical conductors 5. A socket 13 into which the cable seal 3, 3' can be inserted in form-fitting fashion, is moreover situated in the connection region 11, 11'. The connection box 10 has a cover 15 which has recesses 16 for the cable 4 for the closed state. The cover 15 can be firmly screwed to the housing of the connection box 10 via screws 7.

Figures 2, 3:
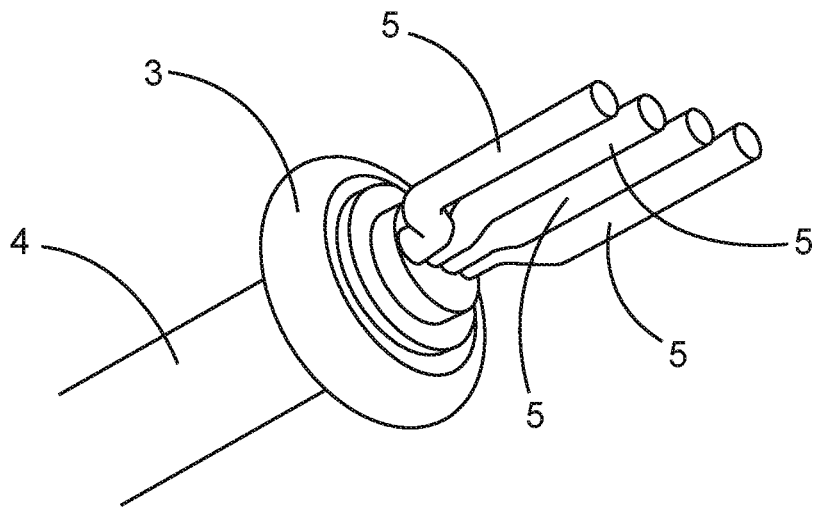
FIG. 2 shows a perspective illustration of a cable with free electrical conductors in the end region and a cable seal injection-molded in front of them.
FIG. 3 shows a perspective illustration of a cable with a cable manager.

The end section of a cable 4, which has had the cable sheath removed, can be seen in FIG. 2. In this case it is a four-core cable with, correspondingly, four electrical conductors 5 which each have an insulating sheath in a different color. The colors are standardized globally. Thus, for example, a green and yellow color code represents the ground potential. The conductors 5 are fanned out as illustrated in FIG. 2. They can then be inserted, for example, in an injection mold and provided with a cable manager 2, 2' in an injection-molding method, as shown for example in FIG. 3. Alternatively, two-part cable managers 2", 2" may be used, as illustrated in FIGS. 6 and 8.

The connection box 10 has a printed circuit board 17 with control electronics (not illustrated). The printed circuit board 17 can be seen purely schematically in FIG. 4. The printed circuit board plug connector 12 is plugged onto the printed circuit board 17 with the aid of contact pins 9. The contact pins 9 are each electrically connected to traces of the printed circuit board 17. The cable connection region of the printed circuit board plug connector 12 is formed by the insulation displacement terminals 14 of the insulation displacement contacts.

Figures 4, 5:
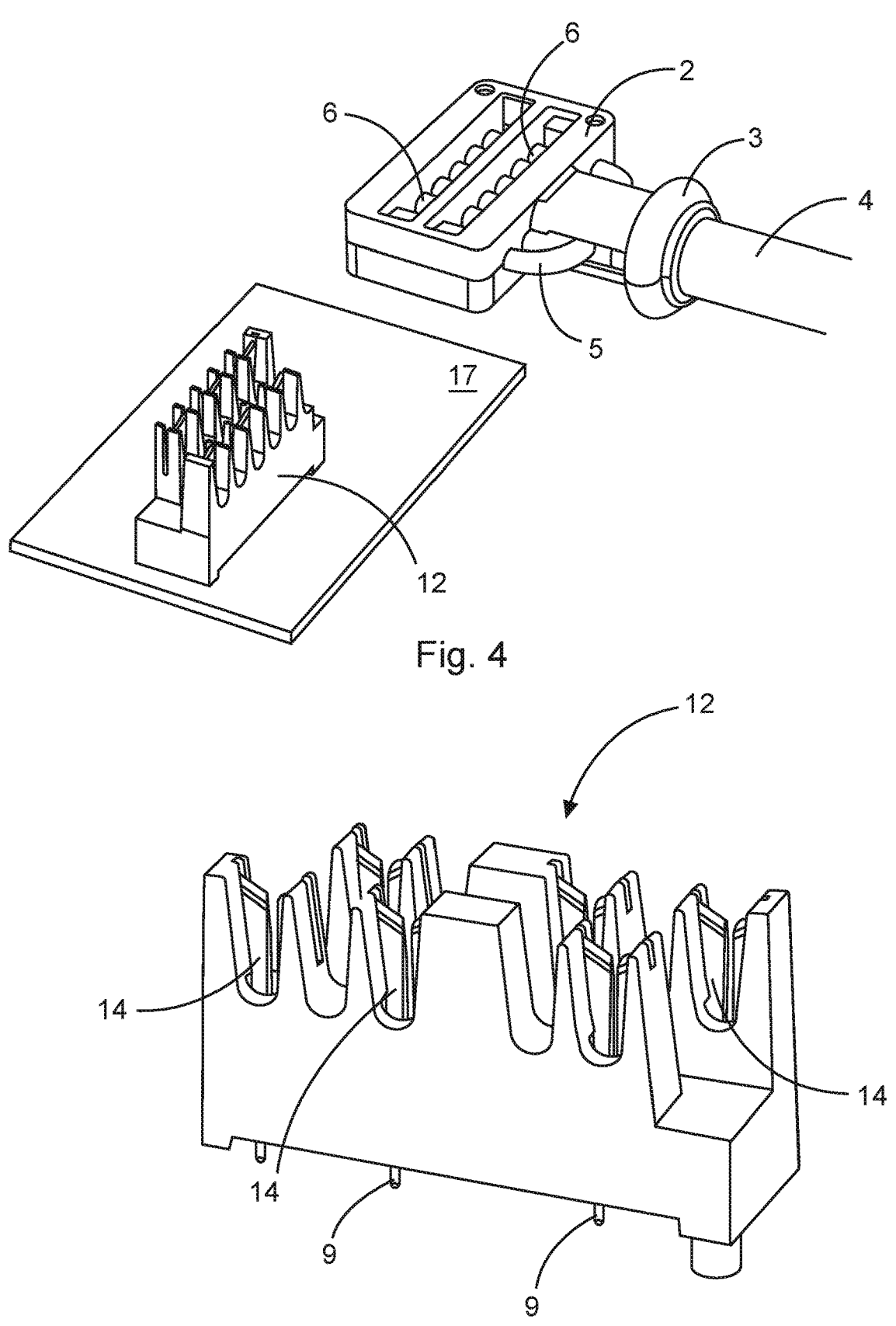
FIG. 4 shows a perspective illustration of a printed circuit board with a cable connection unit.
FIG. 5 shows a perspective illustration of a printed circuit board plug connector.

Once the cable connection unit 1 is positioned or inserted in the connection region 11 of the connection box 10 with a precise fit, the cover 15 of the connection box 10 is closed. Cover ribs 26 are integrally formed in the inside of the cover. As a result, the individual conductors 5 of the cable 4 are pushed into the associated insulation displacement terminals 14 of the printed circuit board plug connector 12 (FIG. 5).

Figure 6:
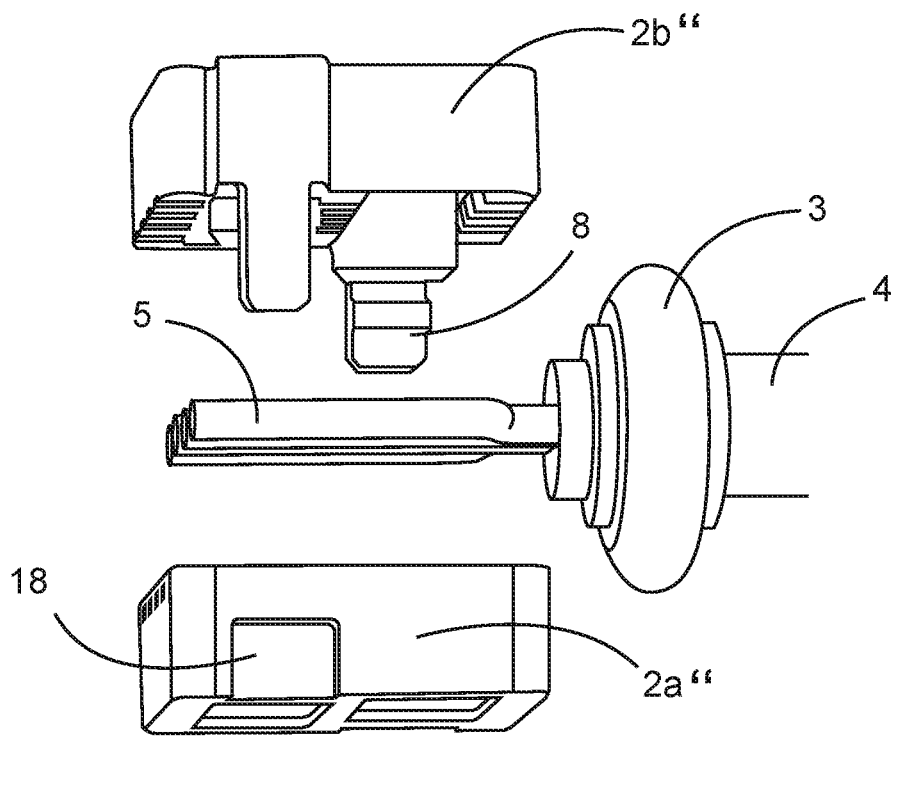
FIG. 6 shows a perspective illustration of a two-part cable manager in an uninterlocked state.
Figure 7:
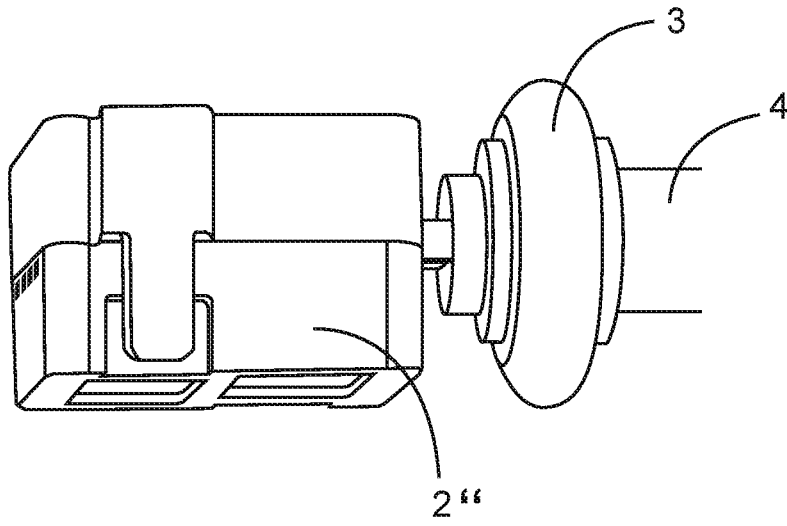
FIG. 7 shows a perspective illustration of a two-part cable manager in an interlocked state.

A first two-part variant of a cable manager 2" is illustrated in FIGS. 6 and 7. The two parts 2a", 2b" can be interlocked with each other with the aid of latching arms 8 of one part 2b" and recesses 18 of the other part 2a" which fit them. The individual conductors 5 are inserted beforehand in one of the two parts 2a", 2b" in a fanned-out fashion and so that they fit.

Figure 9:
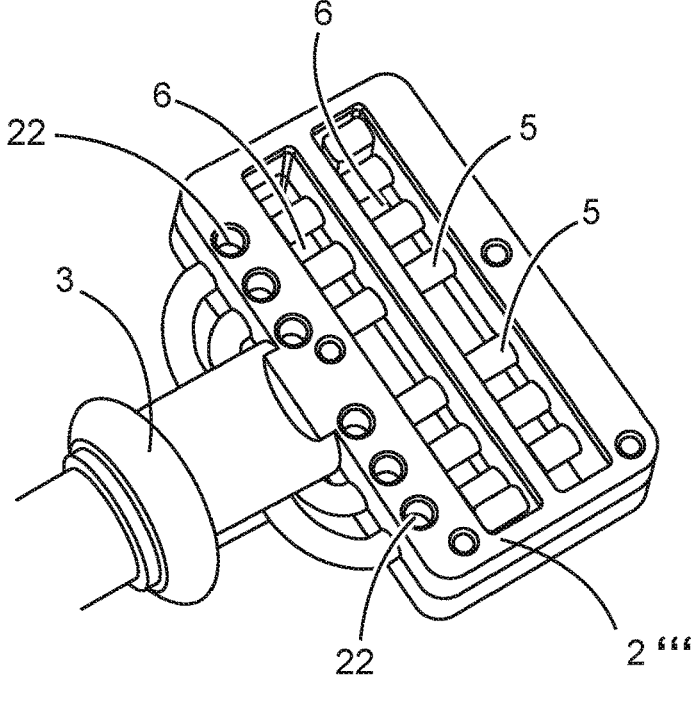
FIG. 9 shows a perspective illustration of a further embodiment of a two-part cable manager with an integrally formed cable seal in an interlocked state.

FIGS. 8 and 9 show a further two-part variant of a cable manager 2". In this case, the two parts 2a", 2b" are interlocked with each other with the aid of studs 20 and stud openings 21 which fit them. The electrical conductors 5 are inserted beforehand in conductor sockets 19 provided for them. The variant of the cable manager 2" shown here is furthermore equipped with the cable seal 3 such that there is also no need for any prior overmolding for this purpose.

Figure 11:
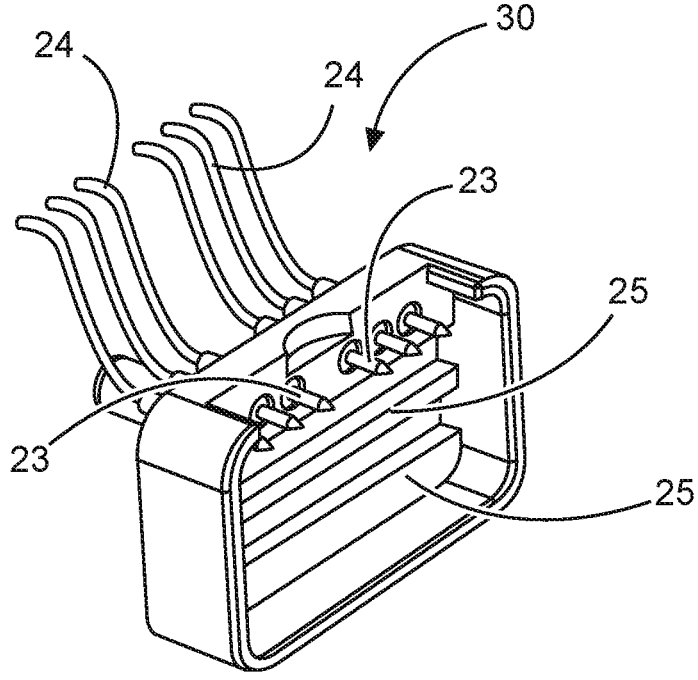
FIG. 11 shows a perspective illustration of a testing device.

Testing openings 22 are provided in the cable manager 2". Each testing opening is associated with an electrical conductor 5 of the cable 4. A test device 30 which is provided with contact pins 23 which can be plugged into the testing openings 22 is shown in FIG. 11. The electrical conductors 5 in the cable manager 2 are electrically contacted as a result. The contact pins 23 are connected at the other end to control conductors 24 which are coupled to testing electronics (not shown). It is thus possible to test whether the electrical contacting of the electrical conductors 5 to the connection box 10 has taken place correctly.

Figure 10:
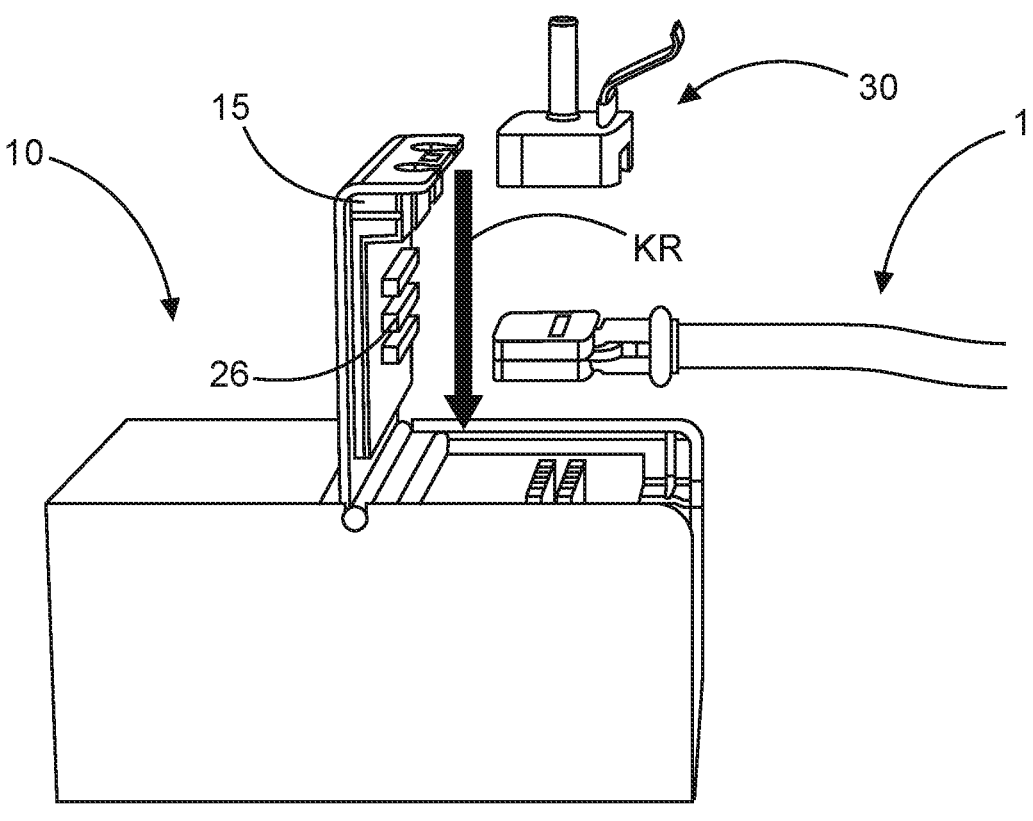
FIG. 10 shows a perspective illustration of a cable connection unit and an associated connection box along with a testing device.

An alternative contacting process of the cable connection unit 1 to the connection box 10 can be seen in FIG. 10. The test device has two ribs 25 on its inside which can be inserted into the contact openings 6 of the cable manager 2, 2', 2", 2" with a precise fit. The connection unit 1 is pushed perpendicularly, in the contacting direction KR, into the connection region 11 of the connection box 10 via the test device 30. The force required to push the electrical conductors 5 into the insulation displacement terminals 14 is thus established via the test device 30. A corresponding signal, for example a green LED, is activated by the test device 30 in the case of successful contacting. The test device 30 is then removed and the cover 15 of the connection box 10 can be closed.

The connection unit 1 can feature cable managers 2, 2', 2", 2" on both sides such that two adjacent connection boxes 10 can be electrically contacted with each other via a connection unit.

Even though different aspects or features of the present disclosure are in each case shown in combination in the Figures, unless stated otherwise it is clear to a person skilled in the art that the combinations illustrated and discussed are not the only ones possible. In particular, mutually corresponding units or groups of features from different exemplary embodiments can be interchanged with one another.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A cable connection unit for a connection box, the cable connection unit comprising:
   a cable having at least two electrical conductors which are surrounded by a cable sheath;
   a cable seal radially enclosing the cable sheath, wherein the cable seal is configured to be received in a cable seal socket of the connection box in a form-fitting manner to assist in providing a sealed environment within the connection box; and
   a cable manager wherein the at least two electrical conductors are held fanned out.

2. The cable connection unit according to claim 1, wherein the cable seal is a one-piece injection-molded part and is fastened to the cable sheath by an injection-molding process.

3. The cable connection unit according to claim 1, wherein the cable manager is a one-piece injection-molded part and is fastened to the electrical conductors by an injection-molding process.

4. The cable connection unit according to claim 1, wherein the cable manager has a two-part design, wherein the two parts can be interlocked with each other via latches.

5. The cable connection unit according to claim 1, wherein the cable manager has two contact openings which each have an essentially rectangular cross-section.

6. The cable connection unit according to claim 5, wherein the contact openings are arranged, in the plugging direction, one behind the other and offset relative to one another.

7. The cable connection unit according to claim 1, wherein the cable has one cable manager and one cable seal at both ends of the cable.

8. The cable connection unit according to claim 1, wherein the cable has a length of no more than three meters.

9. The cable connection unit according to claim 1, wherein the cable manager has testing openings, wherein each testing opening is associated with one of the at least two electrical conductor.

10. A system, comprising:
    a connection box; and
    a cable connection unit including a cable having at least two electrical conductors which are surrounded by a cable sheath, a cable seal radially enclosing the cable sheath, and a cable manager wherein the at least two electrical conductors are held fanned out, wherein the connection box has at least one socket region for the cable connection unit in which the cable seal and the cable manager can each be inserted, and wherein the at least one socket region of the connection box includes a cable seal socket, and the cable seal is configured to be received in the cable seal socket of the connection box in a form-fitting manner to assist in providing a sealed environment within the connection box.

11. The system according to claim 10, wherein the socket region of the connection box has insulation displacement contacts.

12. The system according to claim 11, wherein two of the insulation displacement contacts correlate with one contact opening of the cable connection unit.

13. The system according to claim 10, wherein the connection box has a hinged cover.

14. The system according to claim 10, wherein the system has a test device by which a correct electrical contacting between a respective insulation displacement contact and an associated electrical conductor can be checked.

15. The system according to claim 14, wherein the test device has contact pins which can each be pushed into a testing opening of the cable manager.

16. A method for connecting a cable connection unit to a connection box, the method comprising:

inserting a cable seal and a cable manager connected to one end of a cable of the cable connection unit into a connection region of the connection box, including inserting the cable seal of the cable connection unit into a cable seal socket within the connection region of the connection box; and folding down a cover of the connection box as a result of which electrical conductors of the cable are each pushed into an insulation displacement contact of the connection region and thereby electrically contacted, and whereby the cable seal of the cable connection unit engages the cable seal socket within the connection region of the connection box in a form-fitting manner to assist in providing a sealed environment within the connection box.

17. The method for connecting a cable connection unit according to claim 16, wherein a first end of the cable is connected to a first connection box and a second end of the cable is connected to a second connection box.

18. A method for connecting a cable connection unit to a connection box, the method comprising:

inserting a cable seal and a cable manager connected to one end of a cable of the cable connection unit into a connection region of the connection box, including inserting the cable seal of the cable connection unit into a cable seal socket within the connection region of the connection box such that the cable seal of the cable connection unit at least partially engages the cable seal socket in a form-fitting manner to assist in providing a sealed environment within the connection box; and pushing the cable manager down with a test device.

* * * * *